United States Patent
Jain

(10) Patent No.: US 8,410,828 B2
(45) Date of Patent: Apr. 2, 2013

(54) AREA EFFICIENT EMI REDUCTION TECHNIQUE FOR H-BRIDGE CURRENT MODE TRANSMITTER

(75) Inventor: Rajeev Jain, Greater Noida (IN)

(73) Assignee: STMicroelectronics Pvt Ltd., Greater Noida (IN)

( * ) Notice: Subject to any disclaimer, the term of this patent is extended or adjusted under 35 U.S.C. 154(b) by 163 days.

(21) Appl. No.: 12/979,886

(22) Filed: Dec. 28, 2010

(65) Prior Publication Data

US 2012/0161848 A1   Jun. 28, 2012

(51) Int. Cl.
*H03K 3/00* (2006.01)
(52) U.S. Cl. .......................... 327/110; 327/423; 327/588
(58) Field of Classification Search ................... 327/110, 327/423, 588
See application file for complete search history.

(56) References Cited

U.S. PATENT DOCUMENTS

| | | | |
|---|---|---|---|
| 5,917,340 A | 6/1999 | Manohar et al. | |
| 6,114,826 A * | 9/2000 | Nishiura et al. | 318/685 |
| 6,362,667 B2 * | 3/2002 | Killat et al. | 327/108 |
| 7,176,743 B2 * | 2/2007 | Leonowich et al. | 327/423 |
| 7,417,461 B2 * | 8/2008 | Aoike | 326/82 |

\* cited by examiner

*Primary Examiner* — Kenneth B. Wells
(74) *Attorney, Agent, or Firm* — Hogan Lovells US LLP

(57) ABSTRACT

The invention relates to a driver circuit used to transmit a digital signal from a source device to a destination device. The driver circuit provides a controlled switching time to improve digital signal quality, while reducing electromagnetic interference. In the circuit, a pair of first switches of a first plurality are coupled in parallel between a first current node and respective ones of first and second output terminals. A plurality of pairs of second switches of a second plurality are coupled in parallel between a respective second current node and the first and second output terminals. Timing circuitry applies input signals to the pair of first switches and successive input signals to the pairs of second switches so as to develop a staggered voltage across a load coupled between the first and second output terminals.

22 Claims, 11 Drawing Sheets

AREA EFFICIENT EMI REDUCTION TECHNIQUE FOR H-BRIDGE CURRENT MODE TRANSMITTER

FIELD OF THE INVENTION

The present invention relates to a driver circuit, a method of controlling a driver circuit, and a connector using a driver circuit.

BACKGROUND OF THE INVENTION

Driver circuits are used in many different applications to transmit a digital signal from a source device to a destination device. They operate by switching a supply current or voltage to control the level and polarity of the transmitted signal.

FIG. 1 illustrates switching of a driver circuit by plotting signal level against time. The signal level denotes the signal passed by a transistor which has been turned on at time $T_o$. It will readily be appreciated that the precise values of the high and low signal levels will vary depending on the operating voltage/current of the circuit.

The bold line illustrates a circuit with a symmetric switch-on time and switch-off time. The dotted lines illustrate schematically variations in the switch-on and switch-off times. A rise time Tr is defined as the time taken from 20% of the maximum signal value to 80% of the maximum signal value. Similarly, a fall time Tf is defined as the time taken to drop from 80% of the high signal value to 20% of the high signal value. These times are illustrated in FIG. 1 for the fastest rise time and slowest fall time.

Fast rise and fall times are generally advantageous in a circuit, particularly in the context of digital connectors, such as LVDS (low voltage differential signal) Transmission cables can be subject to a so-called Eye Pattern Test to analyze the quality of a digital signal transmitted by the connector. The eye test is carried out using a tool which provides a sampled version of the signals' oscilloscope display as a mechanism for judging the signals' behavior. An "eye" is defined in the centre of a screen displaying the sampled signal, the eye representing how much space separates ones and zeros in the digital signal to ensure that they do not cross. The more space around the "eye" the better the signal quality. The "eye" is sometimes referred to as a mask or mask region, and for some tests it can take a hexagonal or approximately hexagonal shape. This is referred to herein as a hexagonal eye mask test. Other, similar tests can operate using different shaped "eyes", for example, a diamond shape. However, the hexagonal eye mask test is considered to be the more demanding.

Generally, the faster the switch time, the higher the quality of the signal and the better the separation between ones and zeros or bit levels in a multi level transmission (MLT) environment.

As the quality of the signal degrades, the sample digital wave present on the display starts to extend into the "eye" which is indicative of a low quality and a high probability that ones and zeros will become confused in the destination device.

However, fast switching of transistors through a load generates electromagnetic interference (EMI) which takes the form of radiating high frequency signal components. The faster the rise and fall times, the greater the EMI.

Therefore, it would useful to provide a circuit with a controlled switching time to improve digital signal quality, while reducing electromagnetic interference.

There have been previous attempts. One attempt is RC slew rate control. FIG. 2 illustrates a switch circuit comprising upper switches 2a, 4a and lower switches 2b, 4b. Numeral 6 denotes a resistive load at a destination device (receiver side) coupled between terminals Y and YZ. Each switch path is associated with a capacitor 8 for slowing down the switch transition in conjunction with the resistor 6, according to an RC delay factor.

The switch circuit shown in FIG. 2 operates as a current mode transmitter to drive differential inputs across the load illustrated in the form of resistor 6. Input signals GP, GN are applied to control switches 2a and 2b. 2a is a switch of a first polarity, for example, implemented with a P-channel CMOS transistor and 2b is a switch of a second polarity, for example, implemented as an N-channel CMOS transistor. The complement signals of GP, GN, are applied to switches 4a and 4b, which are similarly switches of a first and second polarity respectively.

When the input signal GP is negative or logic 0, switch 2a is caused to close and switch 4a is open. Its complement signal GN causes switch 2b to close. This creates a current path through 2a, load 6 and switch 2b through which current supplied by a current source 10 can flow. In this way, a differential voltage indicative of the polarity of GP is developed across the load 6. When the polarity of the input signal GP changes, switch 2a opens and switch 4a closes. The input signal GNB causes switch 4b to close while GN opens switch 2b. Thus, a current path is supplied for current from the current source 10 through switch 4a, load 6 and switch 4b, reversing the polarity of the differential voltage. Terminals Y, YZ are coupled to transmitter wires in a cable or the like for transmitting the current to develop a differential voltage at a destination device.

FIG. 2A shows the effect of differing values for RC, where C is the capacitance of capacitor 8 and the effect of those differing values on the signal characteristics in the "eye" test.

One difficulty with this attempt is that as the value of the capacitor increases to slow down the switch transition times and therefore reduce EMI, so the quality of the digital signal subject to the eye test decreases. Thus there is a limit to the effectiveness that can be obtained using this technique. Moreover, relatively large capacitors are required, and it is difficult to control the characteristics of the circuit across PVT (process, voltage, temperature), because of these capacitors. Where EMI levels remain too high, spread spectrum clocking has been used to reduce their effect on circuitry in the source device/connector.

Another attempt to reduce EMI is described in U.S. Pat. No. 5,917,340 which describes a Twisted Pair current driver implemented in CMOS. The driver circuit is divided into four differential drivers labeled S1 . . . S4 in FIG. 3. Each differential driver has a current source which is a fraction of the total current required to be driven. In U.S. Pat. No. 5,917,340, these current values are all equal, at I/4. Each differential driver takes a pair of differential inputs P0, N0; P1, N1; P2, N2 and P4, N4 respectively. The drivers are coupled in parallel across the twisted pair outputs TP+, TP−. The connections between the drivers are not shown in FIG. 3 for the sake of clarity, but it will be appreciated that the TP+ outputs are coupled together, and TP− outputs are coupled together.

The inputs P1, P2 . . . P4 are all derived from a single positive input P0, while the inputs N1, N2 . . . N4 are all derived from a negative input N0. P0 and N0 are differential inputs, such that when the input P0 is positive, the input N0 is negative and vice versa. The positive inputs P1, P2 . . . P4 are derived from the input P0 by respective delay elements 12, each of which delays activation of the respective driver by an amount td. Similarly, for the negative inputs N1 . . . N4.

This provides a smoothing or "staircase" effect for switching the switches on and off, which is illustrated in FIG. 4. FIG. 4 shows the progressive turning on of the switches responsive to the individual inputs P0, P1 . . . P4 and N0, N1 . . . N4 respectively. The delay td is shown operating between each successive activation. At each successive activation, the level of current driven onto the outputs TP+, TP− increases as shown in the lower graph of FIG. 4 which shows the output current $I_{out}$ of the twisted pair outputs TP+, TP−.

The limitations of this approach include the consumption of a large area and the requirement for PVT compensated delay elements for finer steps. Further area is wasted for routing of the PVT compensated delay elements.

SUMMARY OF INVENTION

According to one aspect of the present invention, there is provided a driver circuit comprising: first and second output terminals for connection across a load; a pair of first switches of a first polarity, the first switches coupled in parallel between a first current node and respective ones of the first and second output terminals, the first current node enabling a current of a first value to flow between the first current node and the first or second output terminal; a plurality of pairs of second switches of a second polarity, each pair coupled in parallel between a respective second current node and the first and second output terminals to enable a current portion to flow between the second current node and the first or second output terminal, the current portions summing to the first value; and timing circuitry arranged to apply a first input signal to one of the pair of first switches and a first inverse input signal to the other switch of the first pair, said first input and inverse input signals remaining applied while successive second input signals are applied to the one of each of the pairs of second switches whereby the current enabled to flow through a load successively changes to develop a staggered voltage across the load.

Another aspect of the invention provides a connector for coupling a source device to a destination device, the destination device having a load, the connector comprising a driver circuit having: first and second terminals for connection across the load; a pair of first switches of a first polarity, the first switches coupled in parallel between a first current node and respective ones of the first and second terminals; the first current node enabling a current of a first value to flow through the load; a plurality of pairs of second switches of a second polarity, each pair coupled in parallel between a respective second current node and the first and second terminals to enable a current portion to flow through the load, the current portions of the second current nodes summing to the first value; timing circuitry arranged to apply a first input signal to one of the pair of first switches and a first inverse input signal to the other switch of the first pair, said first input and inverse input signals remaining applied while successive second input signals are applied to the one of each of the pairs of second switches whereby the current enabled to flow through a load successively changes to develop a staggered voltage across the load; and input terminals for receiving said first and second input signals for connection to the timing circuitry.

Another aspect of the invention provides a method of controlling switching in a driver circuit, the driver circuit comprising: a pair of first switches of a first polarity, the first switches coupled in parallel between a first current node and respective first and second terminals; a plurality of pairs of second switches of a second polarity, each pair coupled in parallel between a respective second current node and the first and second terminals, the method comprising: applying an input signal to one of the pair of first switches, whereby said one of the pair of first switches is closed; supplying an inverse input signal to the other switch of the first pair, to open said other switch; and while said input signal and inverse input signal are applied, successively applying second input signals to one of each of the pair of second switches whereby each of said one of the pair of second switches is closed in succession to provide a current path for a current of a first value enabled by the first current node and successive current portions enabled by the second current nodes to flow, such that the current flowing through a load coupled across the first and second terminals successively changes to develop a staggered voltage across the load.

The driver circuit/connector can be implemented in a number of different contexts. It can be used in cameras, particularly according to the compact camera port 2 (CCP2) Standard, with twisted pair cables using low voltage differential signal (LVDS) technology, in a MIPI (Mobile Industry Processor Interface), with universal serial buses (USB's) and in standard I/Os.

For a better understanding of the invention and to show how the same may be carried into effect, reference will now be made by way of example, to the accompanying drawings.

DESCRIPTION OF THE PREFERRED EMBODIMENT

Figure 5:
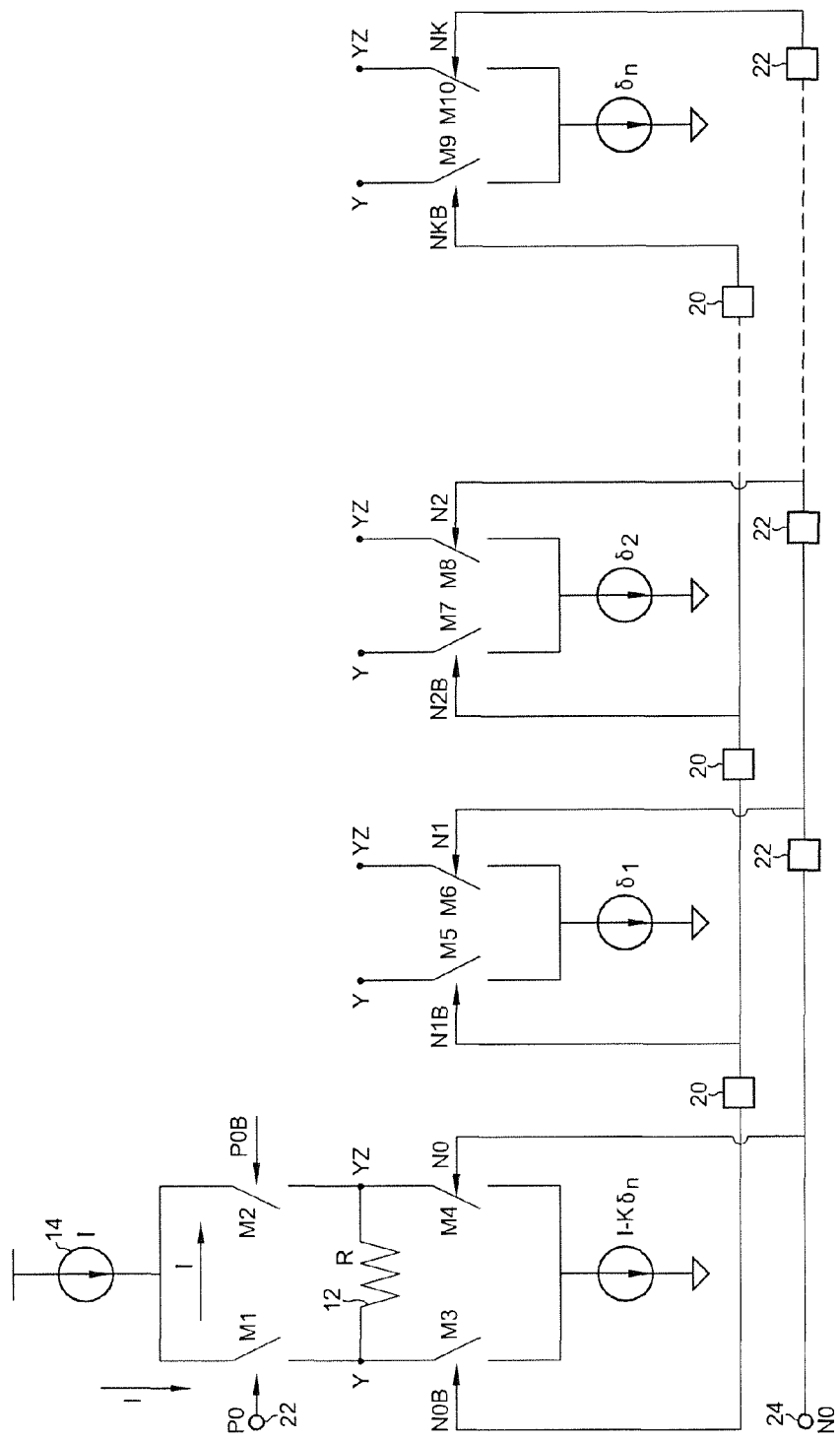
FIG. 5 is a schematic block diagram of a driver circuit in accordance with one embodiment of the invention.

FIG. 5 illustrates an embodiment of the present invention. An H-bridge current mode transmitter is implemented by splitting the upper or lower half of a switch circuit to stagger the output drivers. The transmitter is for driving digital signals (ones and zeros) along a transmitter line, such as a cable, to a receiver.

FIG. 5 is somewhat schematic and for reasons of clarity does not show all of the connections in the circuit. The "upper half" of the circuit comprises a current source 14 providing a current of value I. It has two switches M1, M2 of a first polarity coupled in parallel between the current source and respective first and second output terminals Y, YZ. A resistive load R12 is illustrated to represent the load at the receiver. The switches in the upper half can be implemented, for example, as PMOS transistors. The resistive load 12 is coupled between outputs at the end of transmission lines coupled to terminals Y and YZ. The upper PMOS switches are controlled by pseudo-differential signals. They are referred to herein as "pseudo-differential" because input signals P0, P0B are applied without regards to a staggered timing, while the signal which represents their inverse, N0, N0B are staggered signals as will be described in more detail in the following. The input signals P0, N0 are received at input terminals 22, 24 of the driver circuit. The inverse signals P0B, N0B are derived from P0, N0 respectively by inversion.

The lower part of the circuit comprises a plurality of switch pairs coupled in parallel across outputs terminals Y, YZ. The switch pairs are denoted M3, M4; M5, M6; M7, M8; M9, M10, and can be implemented for example as NMOS transistors. There are K such switch pairs. Each switch pair is associated with a current having a current value which represents a portion of the current I. For the switch pair M3, M4, the current portion is labeled I-K $\delta_n$. For the switch pair M5, M6, the current portion is labeled $\delta 1$. For the switch pair M7, M8, the current portion is labeled $\delta 2$ and for the switch pair M9, M10, the current portion is labeled $\delta_n$. These current portions can be of equal magnitude or of differing magnitudes, the only requirement being that they add up to the value of the current I supplied by current source 14. In the described embodiment, I-K$\delta_n$ is larger than the other current portions as described later.

The lower switch circuits are controlled by staggered timing signals N0, N1, N2 ... NK; N0B, N1B, N2B ... NKB. Each signal N1 ... NK is derived from the input signal N0 after a predetermined delay td provided by respective delay elements 22. Each signal N1B ... NKB is derived from the inverse input signal N0B after a predetermined delay td provided respective delay elements 20.

Figure 6:
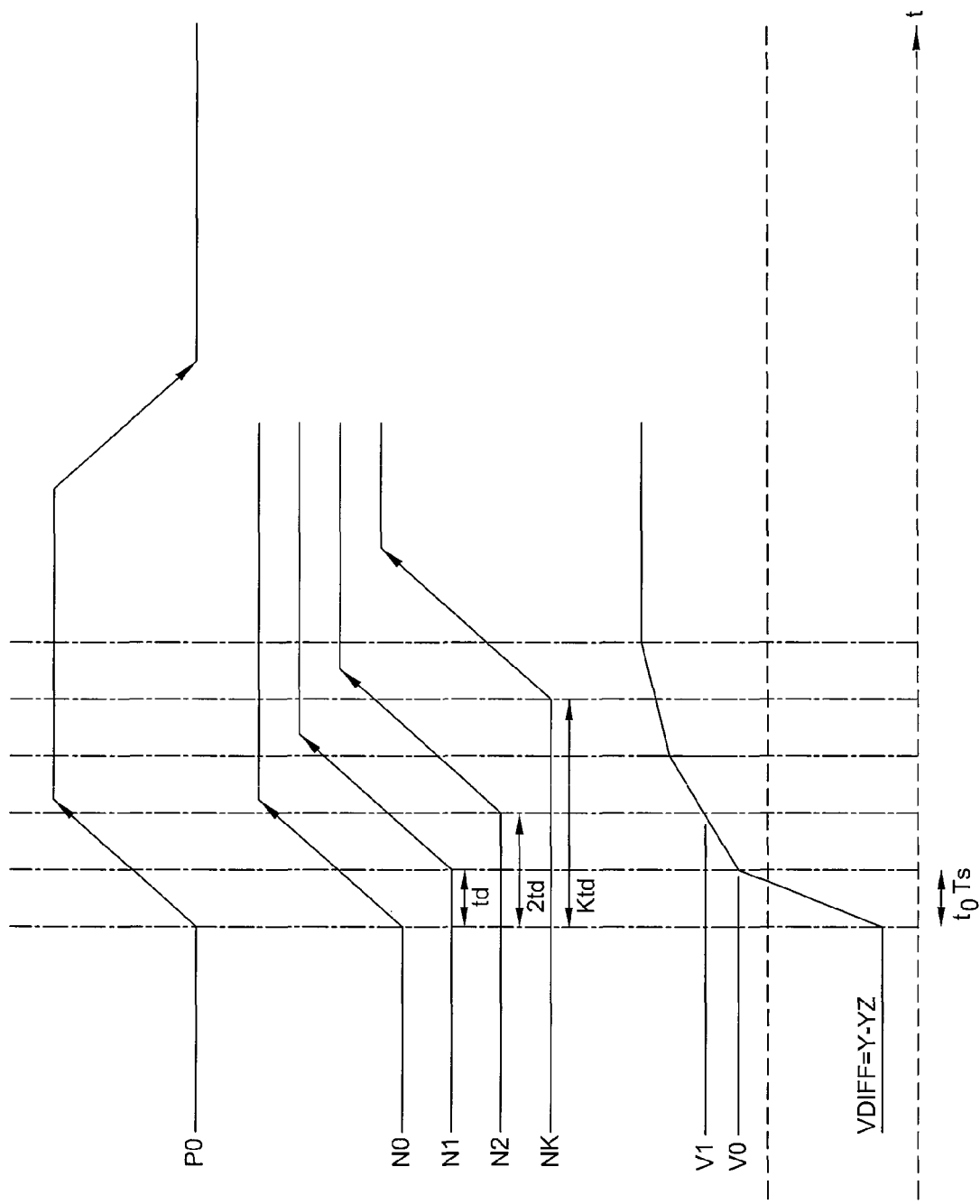
FIG. 6 is a timing diagram for the driver circuit of FIG. 5.

Operation of the circuit will now be described with reference to FIG. 6. FIG. 6 is a timing diagram showing progressive turn-on and off of the switches of the staggered driver circuit. The top line shows the signal P0 applied at time zero and the signal N0 applied at time zero. The following description applies to the example where the upper transistors are PMOS, and the lower transistors are NMOS. It will be appreciated that the logic and polarity can easily be reversed, wherein a logic 1 for PMOS switches would be logic 0 for NMOS switches. To start with, when P0=1 and N0, N1, ... NK=0, switches M2, M3, M5, M7, M9 are ON. Current I from top flows from M2 and I-K$\delta$n flows into M3. Current $\delta 1$ flows from M5, $\delta 2$ from M7 and $\delta$n from M9. The total current I goes onto ground. When P0 switches to 0 and N0 switches to 1, M1 and M4 are turned ON, and M2, M3 are turned OFF. However M5, M7 and M9 are still on and conduct their respective currents of $\delta 1$, $\delta 2$, $\delta$n. So M1 conducts current I but only I-K$\delta$n flows through M4 and the remaining current flows through M5, M7 and M9. The voltage at Y rises to R*(I-K$\delta$n) only as K$\delta$n current is flowing in the opposite direction. After delay td, M5 turns OFF and M6 turns ON and thus potential at Y rises by R*($\delta 1$). Note that M7 and M9 are still ON and drain the remaining current. After delay 2td M7 turns OFF and M8 turns ON and thus potential at Y rises by another R*($\delta 2$). This operation continues until after Ktd potential RI is attained at Y.

A differential voltage Vdiff thus develops across the outputs Y and YZ. FIG. 6 shows the first component of the rise to a value V0 over time Ts. This is a relatively fast switch on time up to V0. This initial "boost" can be designed to avoid encroachment in the "eye" area of a hexagonal/diamond eye test. The value V0 is equal to R×(I-K $\delta_n$). After delay td, N1 is applied turning M6 ON and M5 off, as described above. After delay 2d, N2 is applied and so on up to Ktd, when NK is applied. In the embodiment of FIG. 5, the values of the current drains vary between the switch circuits, as can be seen from the difference between the subsequent voltage levels at each subsequent delay time. In the particular embodiment illustrated, $\delta_1=\delta_2$, $\delta_2=2\ \delta_3$, $\delta_3=\delta_4$, but it will be appreciated that any values are possible depending on the desired turn on characteristics. In particular it is preferred in some circumstances to have equal steps. As an alternative to having current drains of differing sizes, the value of the current drawn can be determined by sizing the transistors.

A similar effect occurs when the driver circuit receives the trailing edge of the input signal (P0 falling to zero), with the current decreasing in a staggered way as NK, then N2, then N1 successively change polarity to successively discharge via the drain transistors.

In FIG. 5, it is the lower part of the circuit which is shown divided into a plurality of switch circuits. It will readily be appreciated that the invention could be operated by having a single lower switch circuit pair and a current drain of value I, and split upper switch pairs associated with differing current source values.

As mentioned, the switches in the upper half can be PMOS transistor with the lower halves being NMOS transistors, or vice-versa. Other alternatives are possible, for example, upper and lower transistors can both be NMOS type, or PMOS type. The switches can be implemented with transmission gates, BJT's or any suitable switches.

The invention has the advantage that delay elements are only required for one half of the circuit, either the PMOS or the NMOS switches. So the number of delay elements is reduced. As delay elements generally have to be PVT compensated, the compensation itself requiring a lot of area, this is a significant reduction in the area required for the circuit on-chip.

While the examples illustrated show the same delay for each delay element, different delays may be provided.

Figure 1:
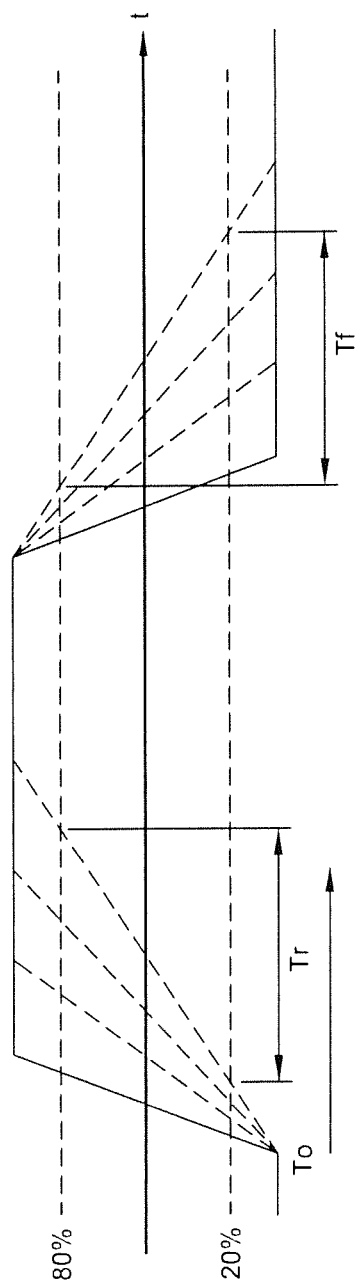
FIG. 1 is a timing diagram illustrating switch rise and fall times in a driver circuit.
Figure 2:
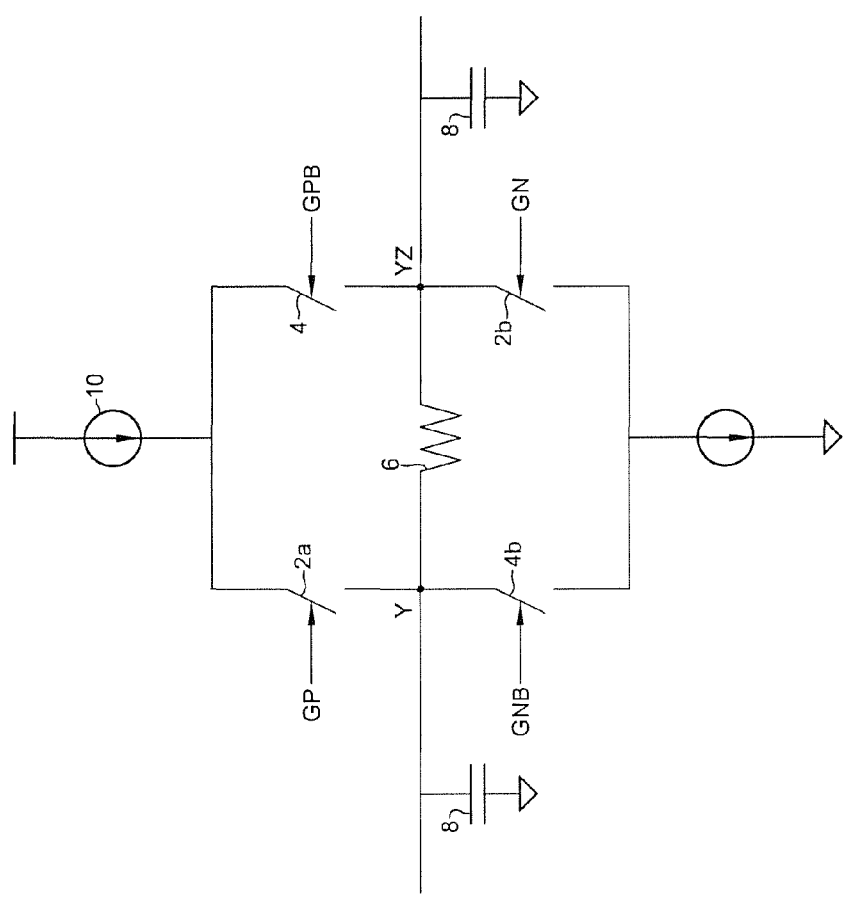
FIG. 2 is a circuit diagram of an H-bridge current mode transmitter with RC slew delay.
Figure 2A:
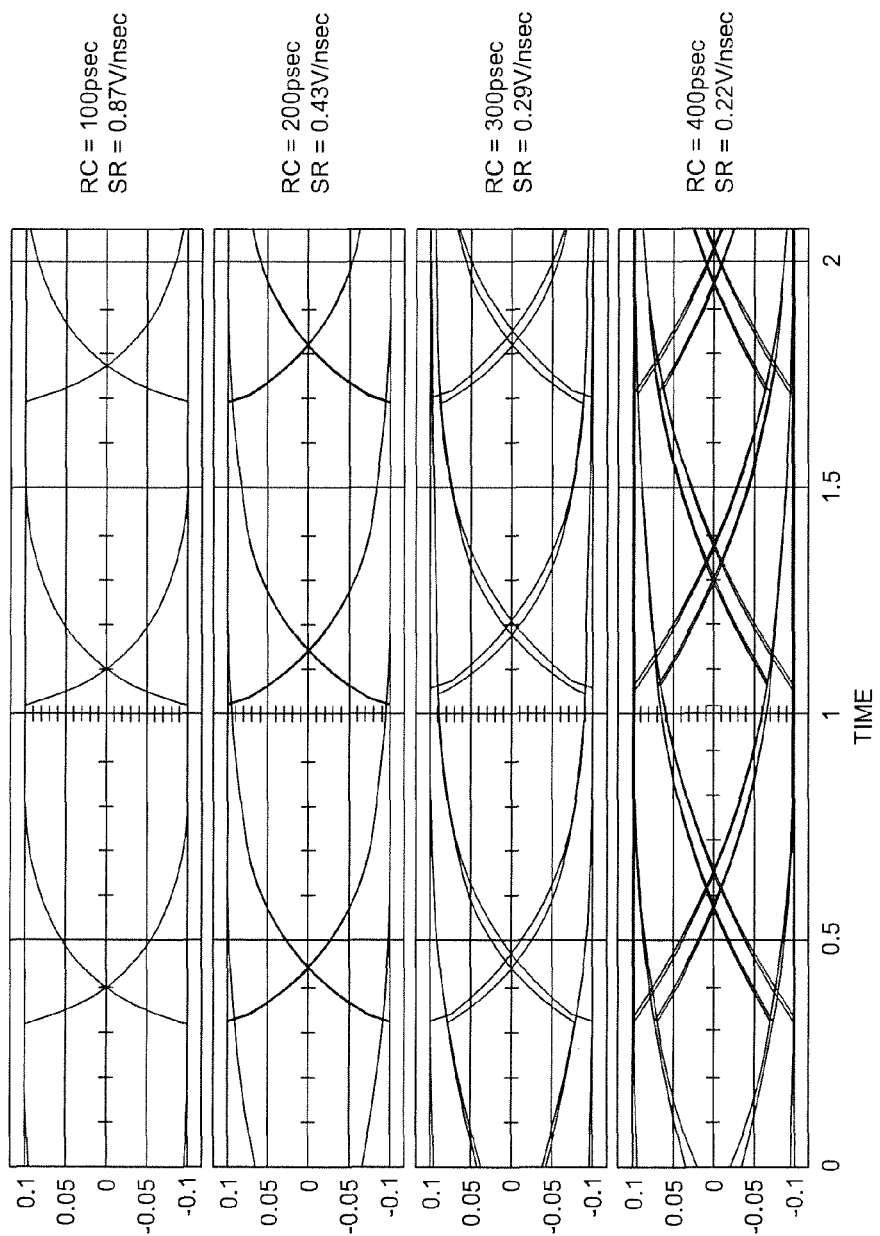
FIG. 2A shows the effect of differing values for RC in the circuit of FIG. 2.
Figure 3:
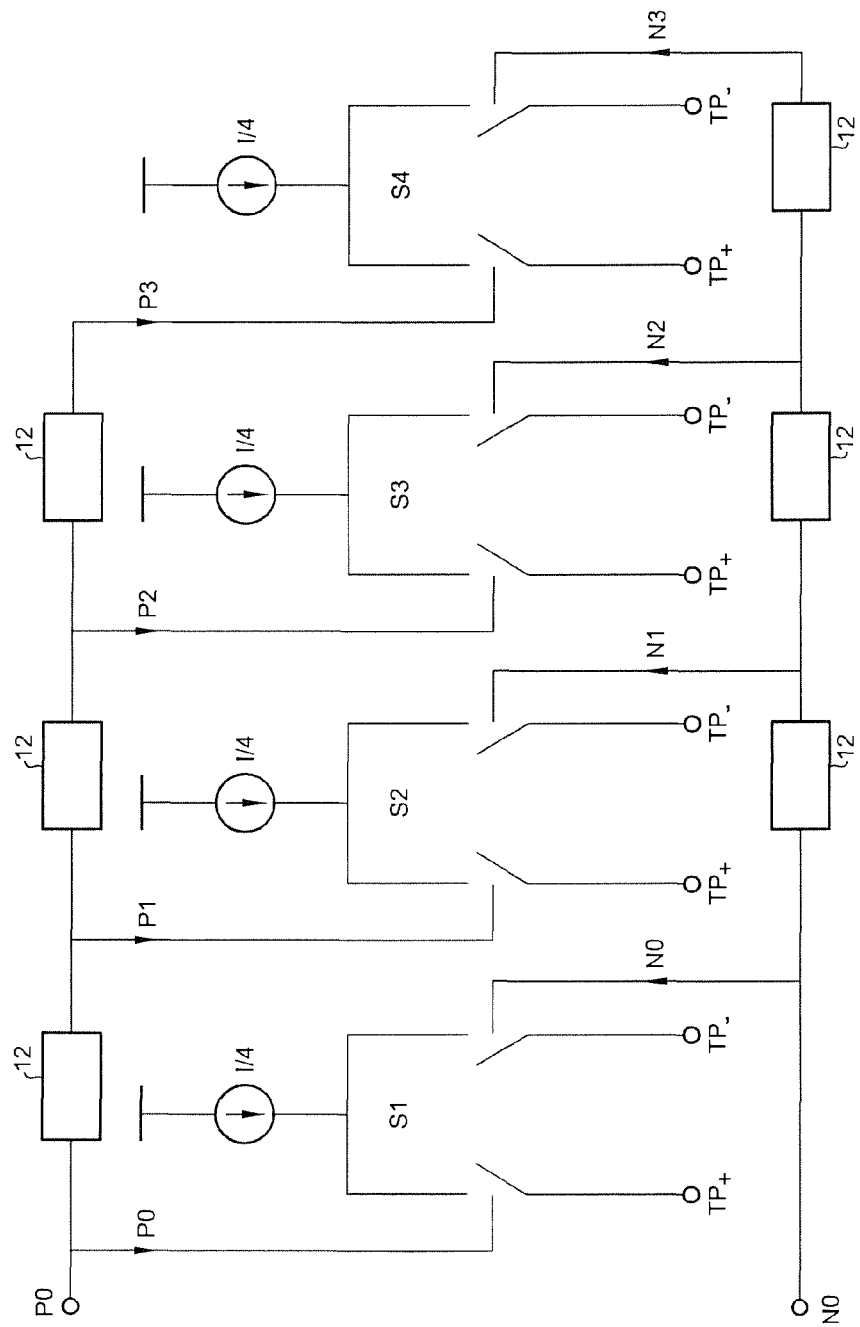
FIG. 3 is a schematic diagram of a prior art twisted pair current driver.
Figure 4:
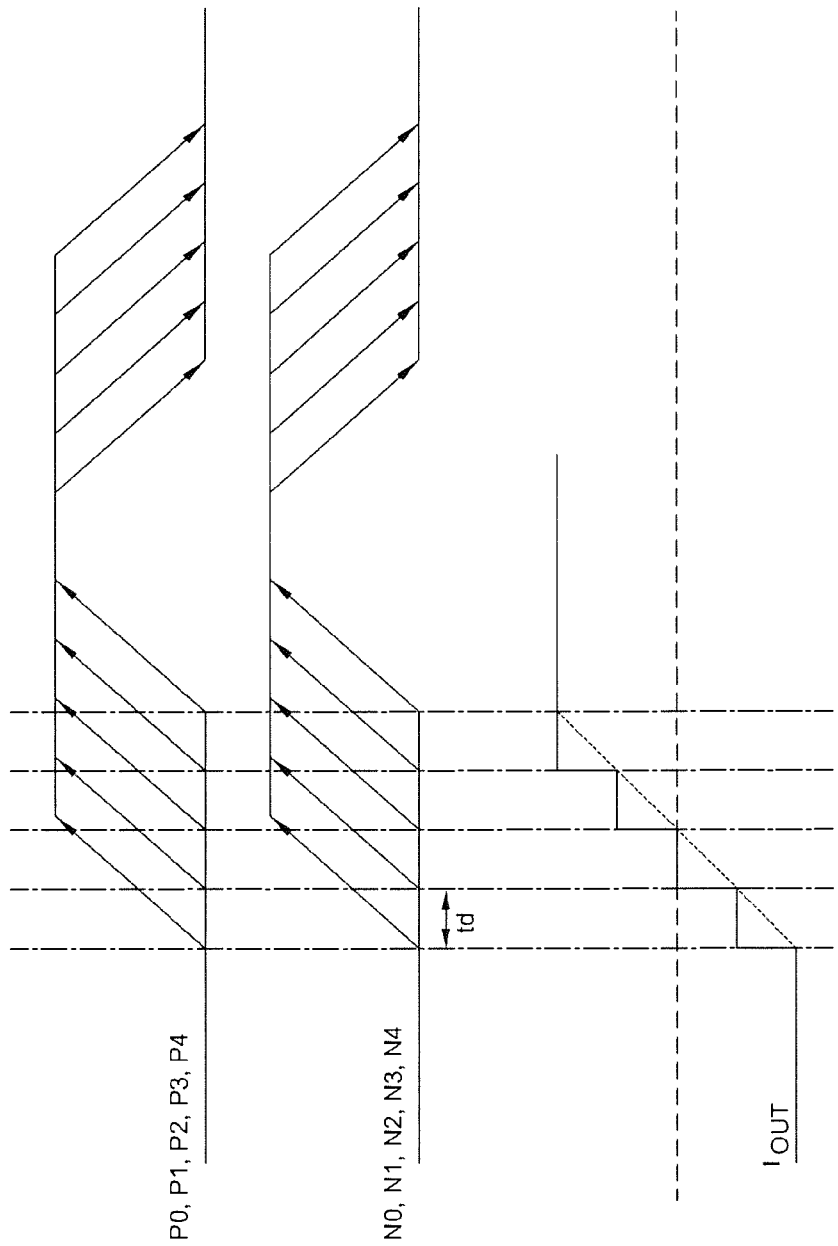
FIG. 4 is a timing diagram for the circuit of FIG. 3.
Figure 7:
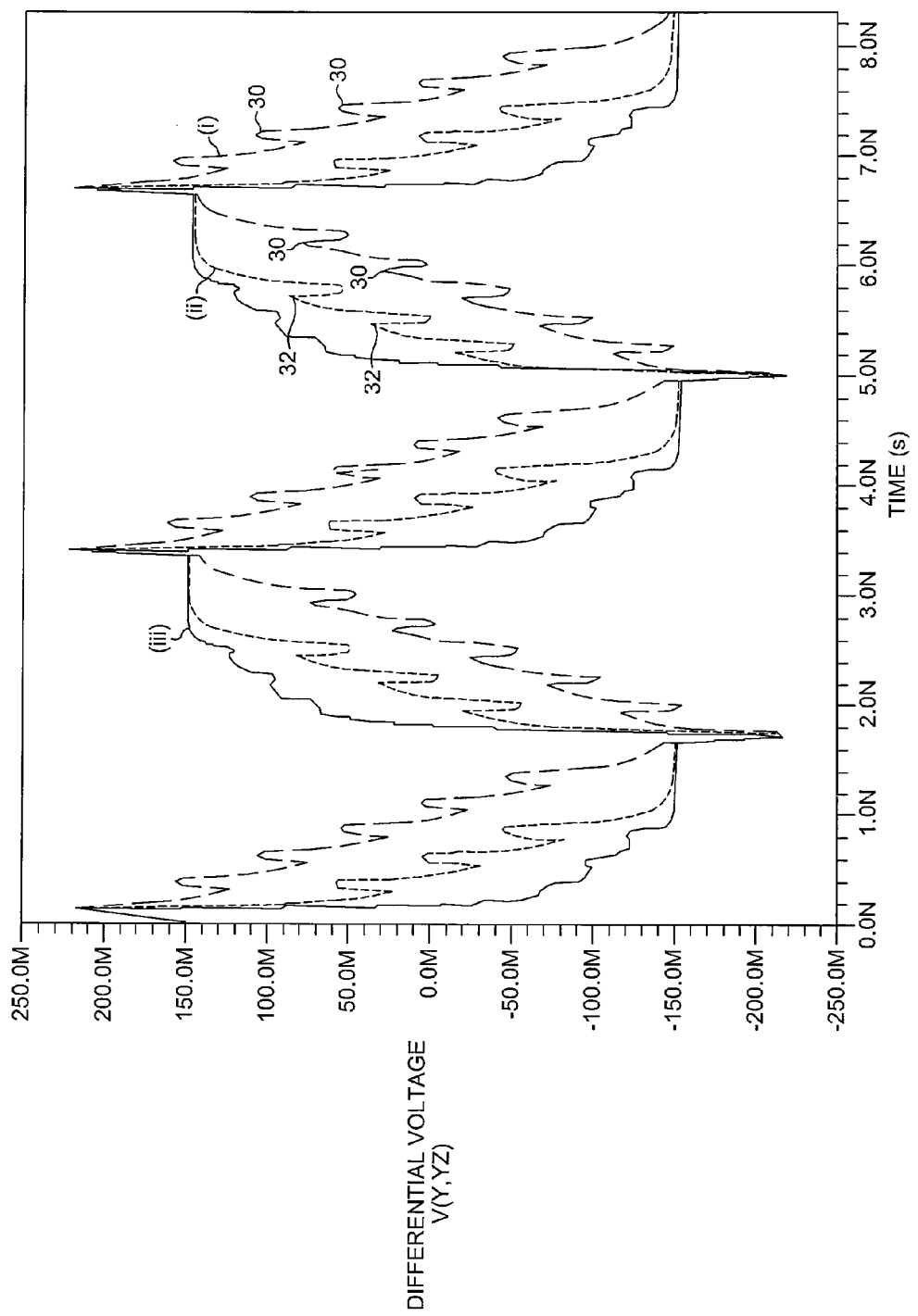
FIG. 7 is a graph depicting signal values against time.
Figure 8A:
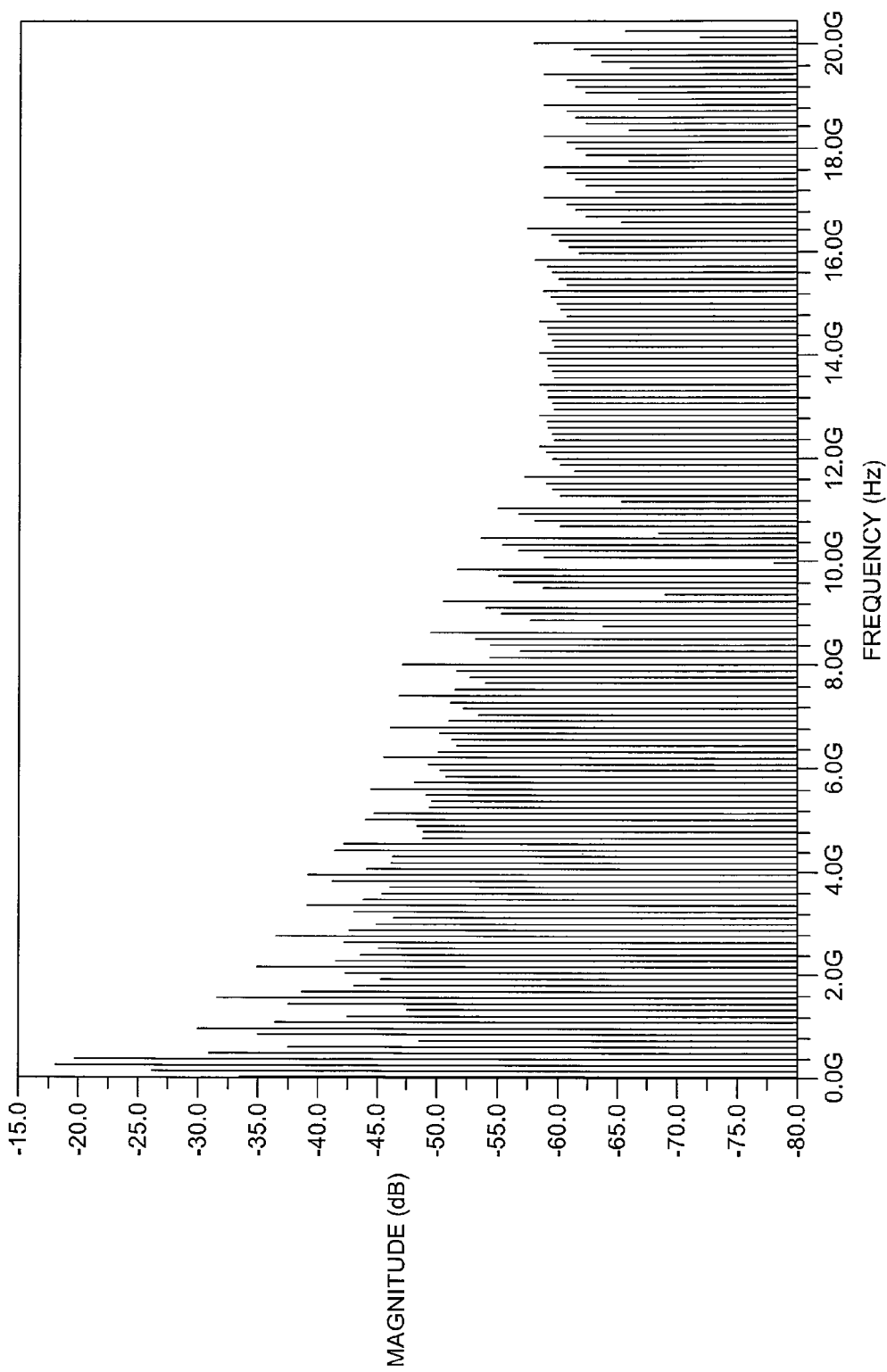
FIG. 8A to 8C are Fourier transforms.

Additional advantages of the invention will now be discussed with reference to FIGS. 7 and 8. Consider the prior art circuit of FIG. 3 and consider a modification where each of the switches S1 to S4 is an H-bridge switch with upper and lower switch pairs of the type illustrated in FIG. 2. It would in principle be possible to use the staggering arrangement of FIG. 3 with such switches, where the top and bottom halves are staggered in a synchronized manner. In attempting to implement a full staggering, synchronization difficulties arise which have the effect of causing ripples in the signal developed across the load. This is shown in Graph (i) of FIG. 7, where ripples labeled 30 can clearly be seen on the fall and rise edges. Furthermore, the shape of the waveform is not desirable and would not perform well on the eye test because of inadequate separation between ones and zeros. With a "half staggered" arrangement, an initial boost ensures that the differential signal crosses the zero level line to clear the hexagon eye, but there are also ripples 32 on the waveform, which is shown in Graph (ii) in FIG. 7, arising from synchronization difficulties.

Graph (iii) illustrates a signal produced by a driver circuit according to an embodiment of the invention, with relatively smooth rise and fall times and good separation of ones and zeros. As shown in FIG. 7, Graph (iii), and as already described with reference to FIG. 6, the value of the current in the portion of the first circuit can be set at a sufficiently high value that the first part of the rise time is relatively fast. The expectation would be that this would generate unwanted EMI components as compared with, for example, the slower rise times of a full staggered arrangement as shown in Graph (i).

Figure 8B:
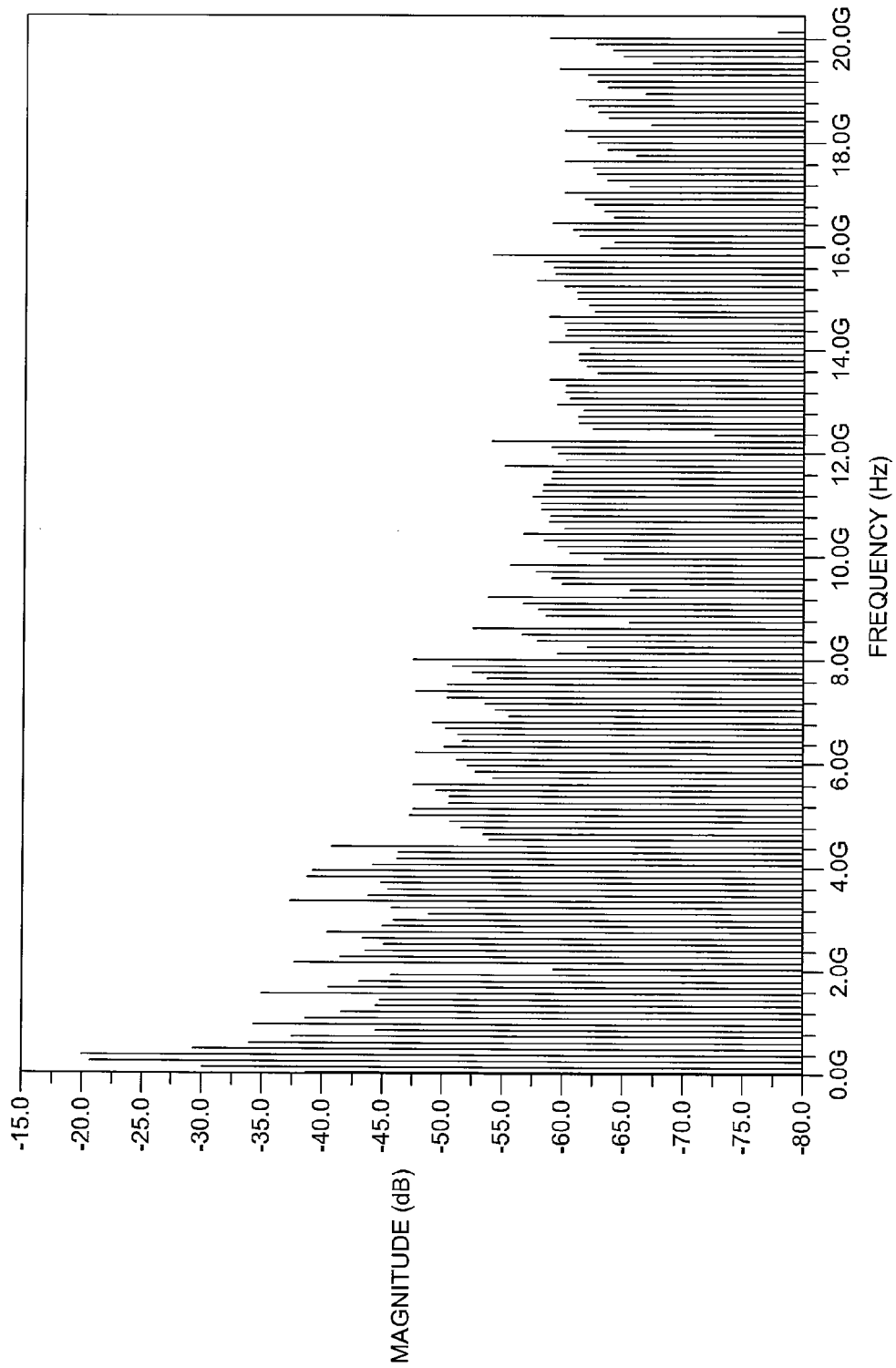
Figure 8C:
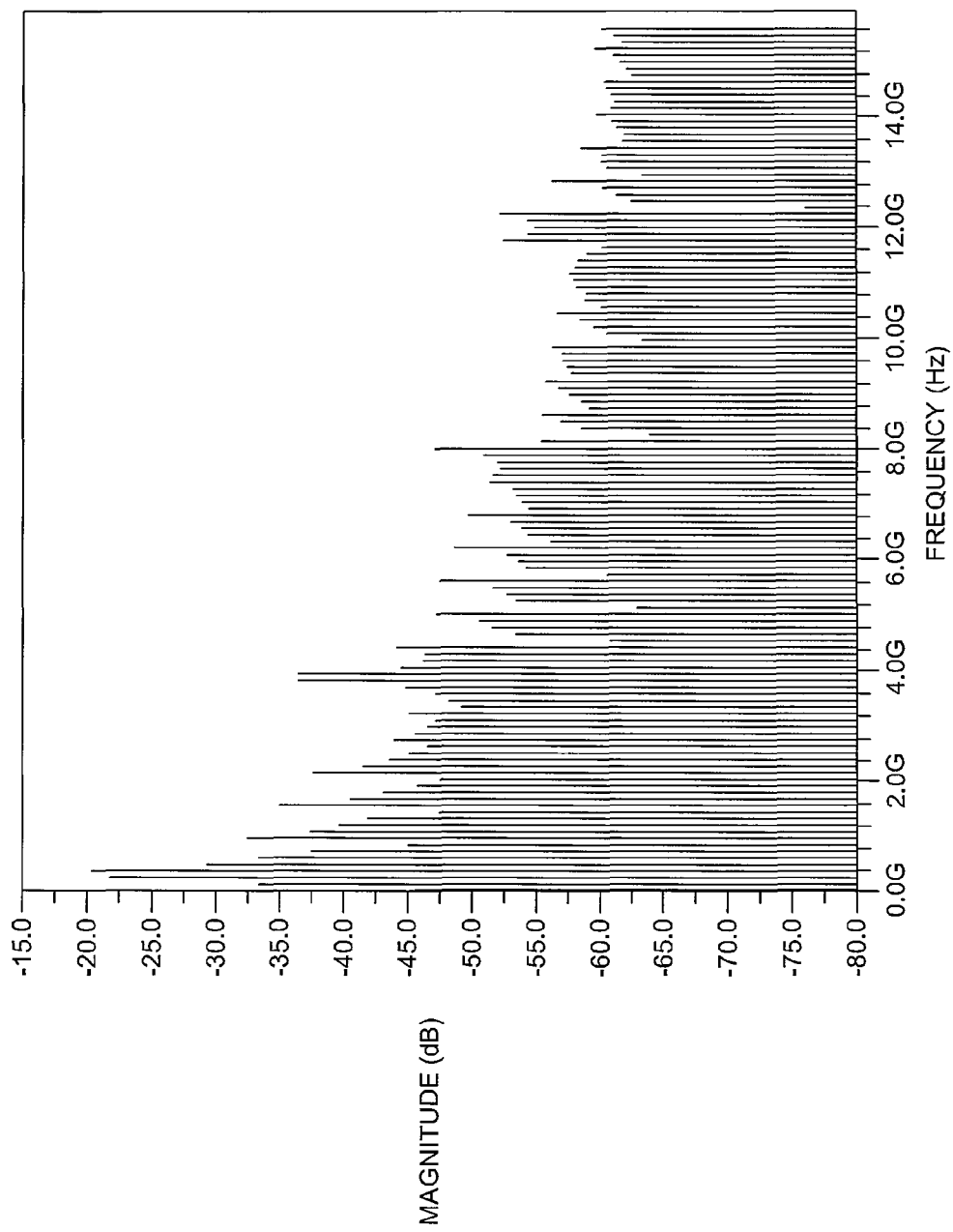

However, analysis of the frequency transform shows that this is not the case. The frequency transform of FIG. 8A corresponds to the proposal of the present invention. The frequency transform of FIG. 8B is a fully staggered arrangement, and the frequency transform of FIG. 8C is a half staggered arrangement. There is not a significant difference between the frequency responses. Therefore, the conclusion can be reached that the proposal according to the present invention can provide embodiments with a frequency response comparable to other arrangements, but with a much improved switch time and signal quality. Furthermore, this can be achieved with lesser circuitry and without the difficulty of synchronizing control signals.

In particular, no synchronization is needed to keep the common mode constant, because the on and off timing of the upper and lower switches does not need to be matched. Therefore, it is significantly easier to design and more reliable in operation.

The circuit has the additional advantage that it is suitable for a Hexagon Eye Mask test.

The circuit can be used in a variety of different scenarios where a low EMI current mode transmitter is required. This includes CCP2, LVDS, MIPI, USB and standard inputs and outputs.

Although the present invention has been described in connection with a preferred embodiment and modifications thereto, those of ordinary skill in the art will understand that many other modifications can be made to the present invention within the scope of the claims that follow. Accordingly, it is not intended that the scope of the invention in any way be limited by the above description, but instead be determined entirely only by reference to the claims that follow.

The invention claimed is:

1. A driver circuit comprising:
   first and second output terminals for connection across a load;
   a pair of first switches of a first polarity, the first switches coupled in parallel between a first current node and respective ones of the first and second output terminals, the first current node enabling a current of a first value to flow between the first current node and the first or second output terminal;
   a first current source coupled between a supply voltage source and the first current node for supplying the current of the first value;
   a plurality of pairs of second switches of a second polarity, each pair coupled in parallel between a respective second current node and the first and second output terminals to enable a current portion to flow between the second current node and the first or second output terminal, the current portions summing to the first value;
   a plurality of second current sources coupled between the respective second current node and ground for supplying each of the current portions summing to the first value; and
   timing circuitry arranged to apply a first input signal to one of the pair of first switches and a first inverse input signal to the other switch of the first pair, said first input and inverse input signals remaining applied while successive second input signals are applied to each of the pairs of second switches whereby the current enabled to flow through the load successively changes to develop a staggered voltage across the load.

2. The driver circuit according to claim 1, wherein each switch comprises a PMOS transistor; an NMOS transistor; a bipolar transistor or a transmission gate.

3. The driver circuit according to claim 1, wherein the timing circuitry comprises a plurality of delay elements coupled in series, a first one of the delay elements receiving said second input signal and outputting a delayed version of said second input signal as said successive second input signal, and coupled to supply said delayed version of said second input signal to a successive one of said delay elements, whereby each delay element provides a successively delayed version of the second input signal to the ones of each of the pairs of second switches.

4. The driver circuit according to claim 3, wherein each delay element provides a different delay.

5. The driver circuit according to claim 3, wherein each delay element provides the same delay.

6. The driver circuit according to claim 1, wherein the plurality of second current sources have different current values.

7. The driver circuit according to claim 1, wherein the plurality of second current sources have equal current values.

8. The driver circuit according to claim 1, wherein the load is resistive.

9. The driver circuit according to claim 1, comprising an H-bridge current mode transmitter.

10. The driver circuit according to claim 1, wherein the timing circuitry is further arranged to apply successive second inverse input signals to the other of each of the pairs of second switches whereby said second input signals cause the current flowing through the load to successively increase, and the second inverse input signals cause the current enabled to flow through the load to successively decrease.

11. The driver circuit according to claim 4, wherein the timing circuitry comprises a second plurality of delay elements coupled in series, a first one of the second plurality of delay elements receiving said second inverse input signal and outputting a delayed version of said second inverse input signal as said successive second inverse input signal, and coupled to supply said delayed version of said second inverse input signal to a successive one of said delay elements, whereby each delay element of the second plurality provides a successively delayed version of the second inverse input signal to the others of each of the pairs of second switches.

12. A connector for coupling a source device to a destination device, the destination device having a load, the connector comprising a driver circuit having:
   first and second terminals for connection across the load;
   a pair of first switches of a first polarity, the first switches coupled in parallel between a first current node and respective ones of the first and second terminals;
   the first current node enabling a current of a first value to flow through the load;
   a first current source coupled between a supply voltage source and the first current node for supplying the current of the first value;
   a plurality of pairs of second switches of a second polarity, each pair coupled in parallel between a respective second current node and the first and second terminals to enable a current portion to flow through the load, the current portions of the second current nodes summing to the first value;
   a plurality of second current sources coupled between the respective second current node and ground for supplying each of the current portions summing to the first value;
   timing circuitry arranged to apply a first input signal to one of the pair of first switches and a first inverse input signal to the other switch of the first pair, said first input and inverse input signals remaining applied while successive second input signals are applied to each of the pairs of second switches whereby the current enabled to flow through a load successively changes to develop a staggered voltage across the load; and
   input terminals for receiving said first and second input signals for connection to the timing circuitry.

13. The connector according to claim 12, wherein the first and second terminals are coupled to respective transmitter lines terminating in a resistive load.

14. The connector according to claim 12 implemented in a camera port.

15. The connector according to claim 12, comprising a twisted pair cable coupled to said first and second terminals and having ends of connection to a resistive load.

16. The connector according to claim 12, implemented in a wireless mobile device.

17. The connector according to claim 12, implemented in a universal serial bus (USB) port.

18. A method of controlling switching in a driver circuit, the driver circuit comprising:
- a pair of first switches of a first polarity, the first switches coupled in parallel between a first current node and respective first and second terminals;
- a first current source coupled between a supply voltage source and the first current node;
- a plurality of pairs of second switches of a second polarity, each pair coupled in parallel between a respective second current node and the first and second terminals; and
- a plurality of second current sources coupled between the respective second current node and ground, the method comprising:
applying an input signal to one of the pair of first switches, whereby said one of the pair of first switches is closed;
supplying an inverse input signal to the other switch of the first pair, to open said other switch; and
while said input signal and inverse input signal are applied, successively applying second input signals to one of each of the pair of second switches whereby each of said one of the pair of second switches is closed in succession to provide a current path for a current of a first value enabled by the first current node and successive current portions enabled by the second current nodes to flow, such that the current flowing through a load coupled across the first and second terminals successively changes to develop a staggered voltage across the load, and wherein the plurality of second current sources supply the current portions summing to the first value.

19. The method according to claim 18, wherein the current flowing through the load successively increases to develop a staggered increasing voltage across the load.

20. The method according to claim 18, further comprising, while said input signal and inverse input signal are applied, successive second inverse input signals to the other of each of the pair of second switches whereby each of said other of the pair of second switches is closed in succession to provide a current path for a current of a first value enabled by the first current node and successive current portions enabled by the second current nodes to flow, such that current flowing through a load coupled across the first and second terminals successively decreases to develop a staggered decreasing voltage across the load.

21. The method according to claim 18, wherein the plurality of second current sources have different current values.

22. The method according to claim 18, wherein the plurality of second current sources have equal current values.

* * * * *